United States Patent [19]

Illers et al.

[11] Patent Number: 4,606,994

[45] Date of Patent: Aug. 19, 1986

[54] PROCESS FOR PRODUCING PHOTO-CURED PRINTING PLATES POSSESSING A DEFINED HARDNESS

[75] Inventors: Karl H. Illers, Otterstadt; Mong-Jon Jun, Speyer; Gunnar Schornick, Neuleiningen, all of Fed. Rep. of Germany

[73] Assignee: BASF Aktiengesellschaft, Ludwigshafen, Fed. Rep. of Germany

[21] Appl. No.: 726,286

[22] Filed: Apr. 23, 1985

Related U.S. Application Data

[63] Continuation of Ser. No. 637,838, Aug. 6, 1984, abandoned.

[30] Foreign Application Priority Data

Aug. 5, 1983 [DE] Fed. Rep. of Germany ....... 3328285

[51] Int. Cl.$^4$ .................................................. G03C 7/00
[52] U.S. Cl. ..................................... 430/300; 430/281; 430/284; 430/285; 430/306; 430/330; 430/349; 430/494
[58] Field of Search ............... 430/286, 284, 285, 330, 430/349, 494, 281, 300, 302, 306

[56] References Cited

U.S. PATENT DOCUMENTS

| | | | |
|---|---|---|---|
| 2,948,611 | 8/1960 | Barney | 96/35 |
| 3,503,861 | 3/1970 | Volpe | 204/195 |
| 3,658,351 | 4/1972 | Benjamin et al. | 279/1 B |
| 3,864,133 | 2/1975 | Hisamatsu et al. | 96/115 P |
| 3,960,572 | 6/1976 | Ibata et al. | 96/115 P |
| 4,006,024 | 2/1977 | Ibata et al. | 96/115 R |
| 4,057,431 | 11/1977 | Finelli et al. | 96/115 R |
| 4,145,222 | 3/1979 | Etoh et al. | 96/115 P |
| 4,158,652 | 6/1979 | Koleske et al. | 260/29.4 UA |
| 4,175,963 | 11/1979 | Crivello | 430/281 |
| 4,214,965 | 7/1980 | Rowe et al. | 204/159.15 |
| 4,220,704 | 9/1980 | Etoh et al. | 430/281 |
| 4,221,646 | 9/1980 | Finelli et al. | 204/159.19 |
| 4,223,119 | 9/1980 | Koleske et al. | 528/66 |
| 4,243,569 | 1/1981 | Koleske et al. | 260/29.6 R |
| 4,251,618 | 2/1981 | McCartin et al. | 430/330 |
| 4,267,961 | 5/1981 | Martin et al. | 430/281 |
| 4,269,680 | 5/1981 | Rowe | 204/159.17 |
| 4,340,657 | 7/1982 | Rowe | 430/56 |
| 4,399,239 | 8/1983 | Herwig et al. | 430/284 |
| 4,415,649 | 11/1983 | Munger et al. | 430/905 |
| 4,438,189 | 3/1984 | Geissler et al. | 430/905 |
| 4,446,227 | 5/1984 | Proskow | 430/286 |
| 4,465,572 | 3/1984 | Graham | 430/908 |
| 4,465,760 | 8/1984 | Leyrer et al. | 430/328 |
| 4,517,278 | 5/1985 | Sakurai | 430/286 |

FOREIGN PATENT DOCUMENTS 1481472 7/1977 United Kingdom .

*Primary Examiner*—Jack P. Brammer
*Attorney, Agent, or Firm*—Keil & Weinkauf

[57] ABSTRACT

Photocured layers possessing a defined controllable hardness are produced by exposing a layer of a photopolymerizable or photocrosslinkable mixture, which contains a partially crystalline polymeric binder possessing olefinic double bonds capable of undergoing polymerization, to actinic light, by a method in which the photocurable layer, prior to exposure to actinic light, is subjected to a heat treatment in which the partially crystalline parts of the polymeric binder are partially or completely fused.

6 Claims, No Drawings

PROCESS FOR PRODUCING PHOTO-CURED PRINTING PLATES POSSESSING A DEFINED HARDNESS

This application is a continuation of application Ser. No. 637,838 filed on Aug. 6, 1984, now abandoned.

The present invention relates to a process for the production of photocured layers possessing a defined controllable hardness, by exposing to actinic light a photoinitiator-containing photosensitive layer based on a partially crystalline polymer which possesses olefinic double bonds capable of undergoing polymerization.

Photocured layers, for example, coatings, photopolymeric relief or printing plates or resist images are generally produced using photosensitive layers of photopolymerizable or photocrosslinkable mixtures which are exposed uniformly or imagewise to actinic light, depending on the intended use. In the case of imagewise exposure, the unexposed areas of the layer can subsequently be removed in a suitable manner, for example by washing out with developer, to form a relief structure or a resist image.

The photopolymerizable or photocrosslinkable mixtures conventionally used for this purpose contain, in addition to a photopolymerization initiator, one or more photopolymerizable olefinically unsaturated, low molecular weight and/or high molecular weight compounds and, in general, compatible saturated and/or unsaturated polymeric binders, with or without further additives and/or assistants. Having various intended uses, a large number of such mixtures based on a large variety of polymeric binders or photopolymerizable compounds have been described, for example mixtures which contain photopolymerizable monomers and are based on nylons (cf. for example French Pat. No. 1,520,865, DE-A No. 22 02 357, DE-A No. 24 54 676 or DE-A No. 30 47 126), polyurethanes or polyurethane-polyureas (cf. for example DE-A No. 24 04 239) or mixtures containing low molecular weight and/or high molecular weight polyurethane acrylates or methacrylates (cf. for example DE-A No. 21 40 306, DE-A No. 24 08 371, DE-A No. 24 27 494, DE-A No. 26 41 189, DE-A No. 28 42 272, DE-A No. 29 17 748, DE-A No. 30 47 026 and DE-A No. 31 31 766) or mixtures which contain polyurethane elastomers possessing allyl or vinyl side groups (cf. for example U.S. Pat. Nos. 2,948,611 and 3,658,351 and DE-A No. 23 00 371).

An essential performance characteristic is the hardness of the cured layers produced from the photopolymerizable mixtures. Depending on the intended use, these layers have in some cases to meet a very wide variety of requirements in respect of hardness. To date, the hardness of the photopolymerized layer had to be established essentially through the recipe for the photopolymerizable mixtures, i.e. the composition of the polymeric binder and/or the ratio in which the polymeric binder was mixed with the photopolymerizable compounds had to be varied in each case to achieve the desired hardness.

It is an object of the present invention to provide a process for the production of layers having a defined hardness, which process starts from a photocurable mixture or layer and, without changing the composition of this mixture or layer, permits the production of selectively photocured layers having different degrees of hardness. The process should be as universally applicable as possible and should be suitable in particular for the production of photopolymeric printing or relief plates or resist images, i.e. the photocurable mixtures or layers employed should be capable of being used as recording materials for optical information fixing, and accordingly should possess good exposure properties, high resolving power, good mechanical properties in the hardened state and the required chemical stability and resistance.

We have found, surprisingly, that this object is achieved if a photocurable, photopolymerizable or photocrosslinkable layer which contains a partially crystalline polymeric binder possessing olefinic double bonds capable of undergoing polymerization is subjected, prior to photocuring of the layer by exposure to actinic light, to a heat treatment in which the partially crystalline parts of the polymeric binder are partially or completely fused without chemical crosslinking or hardening taking place during this procedure.

The present invention accordingly relates to a process for the production of photocured layers having a defined, controllable hardness, comprising exposure of a photocurable layer consisting of a photopolymerizable or photocrosslinkable mixture of (a) a partially crystalline, polymeric binder possessing olefinic double bonds capable of undergoing polymerization, (b) if required, one or more photopolymerizable, olefinically unsaturated, low molecular weight compounds and (c) one or more photopolymerization initiators, with or without (d) other conventional additives and/or assistants, to actinic light, wherein the photocurable layer, before being exposed to actinic light, is subjected to a heat treatment in which the partially crystalline parts of the polymeric binder (a) are partially or completely fused, depending on the temperature employed. It is preferable if chemical crosslinking or hardening does not take place during the heat treatment, in particular if it is intended to use this process to produce printing or relief plates or resist images.

We have found, surprisingly, that, in the case of layers of the type under discussion, a novel heat treatment prior to the photocuring step makes it possible to influence the hardness of the photocured layer and, depending on the conditions during the heat treatment, in particular its duration and the temperature employed, permits the hardness of this layer to be varied within wide limits and to be set at a selected level. It may be assumed that the partially crystalline parts of the polymeric binder which are fused during the heat treatment are fixed so firmly and permanently during the subsequent photocuring of the layer that they cannot undergo recrystallization, at least to a marked extent. We have found, furthermore, that the partial or complete fusion of the partially crystalline parts of the polymeric binder (a) and the subsequent fixing of this state during photocuring do not have an adverse effect on other essential performance characteristics of the photocurable or photocured layers, e.g. mechanical strength, flexibility, chemical stability, exposure properties, resolving power, etc., so that the novel process is widely applicable, in particular for the production of printing or relief plates or resist images from photosensitive recording materials for the optical recording of information.

The process according to the invention starts from photocurable layers of photopolymerizable or photo-cross-linkable mixtures which contain a partially crystalline polymeric binder possessing olefinic double bonds capable of undergoing polymerization. The photocurable layers can be self-supporting or can be applied onto a solid base or substrate. For the production of coatings, for example as protective cover sheets or for decorative purposes, it is possible to use any substrates as bases, e.g. metals, wood, plastics, paper or cardboard. For photosensitive recording materials for optical information fixing, for example for the production of printing or relief plates, the photocurable layer is generally firmly bonded on a dimensionally stable rigid or flexible base made of a metal, e.g. steel, aluminum or copper sheet, or a plastic film or sheet, e.g. of polyethylene terephthalate or polybutylene terephthalate. In the production of resist images, the bases used are, for example, copper-plated baseplates, printed circuit boards, printed circuits, etc.

The photocurable layer employed in the novel process contains, as an essential component, one or more partially crystalline polymeric binders (a), whose molecules incorporate olefinic double bonds capable of undergoing free radical polymerization. These polymerizable olefinic double bonds can be present in the polymer main chain of the partially crystalline polymeric binder, but are preferably attached to the polymer main chain in side groups and/or terminal groups. Preferably, the olefinic double bonds are activated double bonds which are conjugated with or adjacent to O, S or N atoms or other carbon-carbon multiple bonds; in particular, they are acryloyl and/or methacryloyl groups. The partially crystalline polymeric binder (a) contains in general from 0.01 to 3% by weight, based on the weight of the said binder (a), of polymerizable olefinic double bonds, the weight of each such bond being calculated as 24. Factors which influence the amount of polymerizable olefinic double bonds in the said binder (a) include both the reactivity of the double bonds and the type of binder (a) generally. The number of these double bonds has a lower limit which is governed by the need for a sufficient number to fix the polymers in their state after the heat treatment, and an upper limit which is determined by the maximum desired degree of crosslinking of the layer after exposure and hardening; this degree of crosslinking should be no higher than the level at which the mechanical properties of the cured layer are still substantially dependent on the partially crystalline polymeric binder (a) and the extent of partial crystallinity. The said binders (a), which, as a rule, are solid, are preferably essentially linear and advantageously have a K value of from 20 to 75, in particular about 30–65, the K value being determined in accordand with Fikentscher, Cellulose-Chemie 13, (1932), 58.

Examples of suitable partially crystalline polymeric binders (a) are polyurethanes, such as polyether-urethanes, polyester-urethanes or polyurethane-polyureas, nylons or urethane-containing nylons, polyether-esters and the like, which contain polymerizable olefinic double bonds. Such partially crystalline polymers and their preparation are known per se and are described in the literature.

Polyurethanes and polyurethane-polyureas which can be used as partially crystalline polymeric binders (a) can be prepared in a conventional manner by reacting diisocyanates with high molecular weight polydiols, suitable olefinically unsaturated compounds which contain one hydrogen atom, or preferably two hydrogen atoms, which are reactive toward isocyanates, and, if appropriate, other low molecular weight chain-lengthening agents, such as diols, amino alcohols and/or diamines, which are conventionally used for the preparation of polyurethanes. Suitable diisocyanates are in principle any aliphatic, cycloaliphatic, aralipatic, aromatic or heterocyclic diisocyanates. Examples of polydiols are the conventional, essentially linear polyether diols, polyester diols, polylactone diols and polycarbonatediols. The molecular weight of the polydiols is in general from 250 to 4,000, preferably from 500 to 2,000. The olefinically unsaturated compounds which are reactive toward isocyanates are, in particular, compounds which possess one or more photopolymerizable olefinic, preferably activated, double bonds and contain one or more, in particular two, hydroxyl and/or amino groups. Suitable chain-lengthening agents are other low molecular weight diols, diamines or aminoalcohols which have molecular weights of, in general, from 60 to 400, the use of such additional chain-lengthening agents depending, inter alia, on the desired properties of the polyurethane. For example, the use of diamines leads to the formation of urea groups in the polyurethane, with the result that harder products are obtained.

The partially crystalline polyurethanes or polyurethane-polyureas contain, as a rule, from 10 to 40, preferably from 15 to 30, % by weight of diisocyanates, from 30 to 85, preferably from 45 to 70, % by weight of polydiols, from 0.1 to 20, in particular about 0.5–15, % by weight of olefinically unsaturated compounds which are reactive toward isocyanates, and from 0 to 20, preferably from 1 to 15, % by weight of other low molecular weight chain-lengthening agents, the percentages in each case being based on the polyurethane or the polyurethane-polyurea. The components for the preparation of the polyurethanes or polyurethane-polyureas are generally employed in a ratio such that the molar ratio NCO/OH,NH is about 0.8–1.3, in particular about 0.9–1.2.

Photocurable layers which have proven very advantageous for the novel process are those which contain, as the partially crystalline polymeric binder (a), polyurethanes or polyurethane-polyureas which possess olefinic double bonds capable of undergoing polymerization and are obtained from aliphatic or cycloaliphatic diisocyanates, e.g. dicyclohexyl methane diisocyanate, hexamethylene diisocyanate, isophorone diisocyanate or trimethylhexamethylene diisocyanate, essentially linear polyether diols, polyester diols and/or polyetherpolyester diols, e.g. polyethylene glycols, polypropylene glycols, ethylene-glycol/propylene glycol cocondensation products, polymers of tetrahydrofuran and butylene oxide, esters of dicarboxylic acids, in particular adipic acid, with $C_2$–$C_{10}$-alkanediols or hydroxyalkanediols of 2 to 6 carbon atoms, e.g. adipates of glycol, diethylene glycol, butane-1,4-diol, hexane-1,6-diol and/or 2,2-dimethylpropane-1,3-diol, diols possessing single polymerizable olefinic double bonds, e.g. butene-1,4-diol, butene-2,3-diol, dimethylolnorbornene or dimethylolcyclohexene, or preferably chain-lengthening, unsaturated carboxylic acid ester diols, e.g. a reaction product of a dicarboxylic acid with a polymerizable olefinically unsaturated glycidyl compound, the reaction product of glycidol and (meth)acrylic acid or the reaction products of diepoxides, for example those based on bisphenol A, with $\alpha,\beta$-unsaturated carboxylic acids, in particular acrylic acid or methacrylic acid; and low molecular weight diols, aminoalcohols or diamines as chain-lengthening agents, it being possible for these compounds furthermore to contain, as copolymerized units, tertiary nitrogen atoms, e.g. ethylene glycol, propanediol, butanediol, neopentylglycol, hexanediol, ethanolamine, N-methylethanolamine, ethylenediamine, hexamethylenediamine, N-methyldiethanolamine, N-ethyldiethanolamine or N-ethyldiisopropanolamine. Partially crystalline polyurethanes or polyurethane-polyureas which can be used according to the invention and possess polymerizable olefinic double bonds are described in, for example, U.S. Pat. No. 2,948,611, DE-A No. 23 00 371 and in particular, DE-A No. 30 47 026 and, DE-A No. 31 31 766.

Apart from the polyurethanes and polyurethane-polyureas, other suitable partially crystalline polymeric binders (a) are nylons possessing photopolymerizable olefinic double bonds. Such nylons can be prepared in a conventional manner from olefinically unsaturated diamines and aliphatically saturated dicarboxylic acids, from diamines and olefinically unsaturated dicarboxylic acids or from olefinically unsaturated lactams. Nylons which possess polymerizable olefinic double bonds and have proven advantageous are those obtained from saturated aliphatic, cycloaliphatic or aromatic diamines, for example polymethylene diamines, such as hexamethylene diamine or decamethylenediamine, diaminodicyclohexylmethane or diaminodiphenylmethane, $\alpha,\beta$-olefinically unsaturated dicarboxylic acids, in particular maleic acid, fumaric acid or tetrahydrophthalic acid or their anhydrides, and, if required, other saturated aliphatic, cycloaliphatic or aromatic dicarboxylic acids, e.g. adipic acid, glutaric acid, hexahydrophthalic acid or terephthalic acid.

Other partially crystalline polymeric binders (a) which can be used in the photocurable layer are urethane-containing nylons in which the polymerizable olefinic double bonds can be present in, for example, side groups. Such urethane-containing nylons can be obtained by, for example, reacting conventional nylons, in particular aliphatically saturated nylons, which are obtained from saturated aliphatic, cycloaliphatic and/or aromatic dicarboxylic acids and saturated aliphatic, cycloaliphatic and/or aromatic diamines, from aminocarboxylic acids or from lactams, and which contain two terminal amino and/or hydroxyl groups with diisocyanates, preferably aliphatic or cycloaliphatic diisocyanates (e.g. dicyclohexylmethane diisocyanate, hexamethylene diisocyanate, isophorone diisocyanate or trimethylhexamethylene diisocyanate), low molecular weight diols, diamines or aminoalcohols possessing polymerizable olefinic double bonds and, if required, other low molecular weight diols, diamines or amino alcohols as chain-lengthening agents. The diols, diamines or amino alcohols possessing polymerizable olefinic double bonds can be compounds with single olefinic double bonds, e.g. butene-1,4-diol, butene-2,3-diol, dimethylolnorbornene or dimethylolcyclohexene, but are preferably compounds with activated olefinic double bonds, in particular unsaturated carboxylic acid ester-diols, such as the reaction products of dicarboxylic acids with polymerizable olefinically unsaturated glycidyl compounds, the reaction product of glycidol with acrylic or methacrylic acid, or the reaction products of diepoxide compounds (for example those based on bisphenol A) with $\alpha,\beta$-unsaturated monocarboxylic acids, in particular acrylic or methacrylic acid. If, in the preparation of the urethane-containing nylons, other diols, diamines or amino alcohols are present as chain-lengthening agents, they can also contain, for example, tertiary nitrogen atoms, which are incorporated in this way into the urethane-containing nylons.

Advantageous urethane-containing nylons contain about 15-65, in particular from 20 to 55, % by weight of nylon building blocks, preferably having a molecular weight of from 500 to 10,000, in particular from 700 to 5,000; from 10 to 50, in particular from 15 to 45, % by weight of diisocyanates; from 0.1 to 20, in particular from 0.5 to 15, % by weight of the compounds which are reactive toward isocyanate and possess polymerizable olefinic double bonds, and from 0 to 30, in particular from 2 to 25, % by weight of other low molecular weight or high molecular weight chain-lengthening agents, the percentages in each case being based on the urethane-containing nylon. To prepare the urethane-containing nylons, the individual components are employed in general in amounts such that the molar ratio NCO/OH,NH is about 0.8-1.85, in particular about 0.9-1.2. Suitable urethane-containing nylons possessing quaternary or quaternizable nitrogen atoms are described in, for example, DE-A No. 30 47 126, but the corresponding urethane-containing nylons without quaternary or quaternizable nitrogen atoms are also very useful.

Other examples of partially crystalline polymeric binders (a) are the polyether-polyesters, as obtainable in a conventional manner when polyether diols, alone or mixed with low molecular weight diols, are reacted with dicarboxylic acids; the polymerizable olefinic double bonds can be introduced via either the diol component or the dicarboxylic acid component. Advantageous polyether-esters are prepared from polyether diols having a molecular weight of in general from 250 to 4,000, preferably from 500 to 3,000, in particular polyalkylene-oxides, such as polyethylene oxide, polypropylene oxide, ethylene oxide/propylene oxide cocondensation products or polybutylene oxide, saturated aliphatic, cycloaliphatic or aromatic dicarboxylic acids, in particular adipic acid, glutaric acid, hexahydrophthalic acid, phthalic acid, terephthalic acid or their derivatives, in particular their anhydrides, olefinically unsaturated diols and/or olefinically unsaturated dicarboxylic acids, e.g. butene-1,4-diol, butene-2,3-diol, vinylglycol, dimethylolnorbornene, dimethylolcyclohexene, unsaturated carboxylic acid ester-diols, in particular those of the type stated above, maleic acid, fumaric acid or tetrahydrophthalic acid, and, as chain-lengthening agents, preferably other low molecular weight aliphatically saturated diols having molecular weights of in particular, from 62 to 400, e.g. ethylene glycol, condensates of ethylene glycol, propanediol, butanediol, hexanediol, decanediol, cyclohexanediol, cyclohexanedimethanol or oxyethylated bisphenol A. Polyetheresters which have proven very advantageous are those which contain, as copolymerized units, from 20 to 50% by weight of polyether diols, from 10 to 40% by weight of aliphatically saturated dicarboxylic acids, from 0.5 to 20% by weight of olefinically unsaturated diols and/or olefinically unsaturated dicarboxylic acids and from 0.5 to 20% by weight of other low molecular weight aliphatically saturated diols, the percentages in each case being based on the polyether-ester. The photocurable layer employed in the novel process can contain, in addition to the partially crystalline polymeric binder or binders (a) possessing olefinic double bonds capable of undergoing polymerization, low molecular weight, photopolymerizable, olefinically unsaturated compounds (b). The addition of such compounds (b) to the photocurable layer depends, inter alia, on the number of photopolymerizable olefinic double bonds in the partially crystalline polymeric binder (a), the desired exposure and curing properties and the other properties desired. If the photocurable layer contains the stated compounds (b), they are preferably compatible with the partially crystalline polymeric binder (a), particularly when the novel process is used to produce printing or relief plates or resist images.

Suitable photopolymerizable, olefinically unsaturated, low molecular weight compounds (b) are the monomers and/or oligomers which are conventionally used for photocurable layers and have a molecular weight of in general as high as about 5,000, preferably as high as about 3,000. The said compounds (b) can be monofunctional or polyfunctional, i.e. they can possess one or more photopolymerizable olefinic double bonds. It is also possible to use mixtures of monofunctional and polyfunctional compounds (b). The polyfunctional compounds (b) are particularly useful for the production of coatings and rapidly crosslinking, curable layers. For the production of resilient and flexible cured layers, in particular resilient and flexible relief printing plates, it has proven advantageous to use monofunctional compounds (b) or mixtures of monofunctional and polyfunctional compounds (b) which contain from 1 to 30, preferably from 2 to 20, % by weight, based on the mixture, of the monofunctional compounds (b).

Examples of the stated compounds (b) are vinyl compounds, e.g. vinyl ethers and vinyl esters, $\alpha,\beta$-olefinically unsaturated mono- and dicarboxylic acids and in particular their derivatives, e.g. maleic or fumaric acid, their alkyl esters, in particular those where alkyl is of 1 to 8 carbon atoms, and particularly preferably acrylic acid and/or methacrylic acid and their derivatives, such as acrylonitrile, methacrylonitrile, acrylamide, methacrylamide, N-methylolacrylamide, N-methylolmethacrylamide, etherification products of N-methylolated acrylamides and methacrylamides, for example those of the glycolamol type, and the esters of acrylic acid and/or methacrylic acid with monohydric or polyhydric alcohols. These include, for example, the diacrylates, dimethacrylates, polyacrylates and polymethacrylates of alkylene glycols, polyalkylene glycols and polyhydric alkanols of 2 to 20 carbon atoms, e.g. those of ethylene glycol, diethylene glycol, triethylene glycol, polyethylene glycols having a molecular weight as high as about 500, propane-1,2-diol, propane-1,3-diol, polypropylene glycols having a molecular weight as high as about 500, neopentylglycol, butane-1,4-diol, 1,1,1-trimethylolpropane, glycerol or pentaerythritol; the monoacrylates and monomethacrylates of such diols and polyols, e.g. ethyleneglycol monoacrylate or monomethacrylate, di-, tri- or tetraethyleneglycol monoacrylate or monomethacrylate, butane-1,4-diol monoacrylate or monomethacrylate or hexanediol monoacrylate or monomethacrylate, and the acrylates and methacrylates of monoalcohols of 1 to 20 carbon atoms, such as methyl acrylate or methacrylate, ethyl acrylate or methacrylate, propyl acrylate or methacrylate, butyl acrylate or methacrylate, hexyl acrylate or methacrylate or 2-ethylhexyl acrylate or methacrylate; and monomers and oligomers which possess two or more olefinically unsaturated double bonds and contain urethane groups and/or amide groups, such as the low molecular weight compounds prepared from aliphatic diols of the above type, organic diisocyanates and hydroxyalkyl acrylates or methacrylates, or the reaction products of acrylic or methacrylic acid with aromatic and/or aliphatic diglycidyl ethers, as well as low molecular weight polyester-acrylates.

The photocurable layers employed in the novel process contain in general from 50 to 100, preferably from 60 to 95, % by weight of the partially crystalline polymeric binder (a) and from 0 to 50, preferably from 5 to 40, % by weight of the low molecular weight, photopolymerizable, olefinically unsaturated compounds (b), the percentages in each case being based on the sum of the components (a)+(b). If the photocurable layer contains polyfunctional, low molecular weight, olefinically unsaturated compounds (b), these are generally present in an amount of not more than 15, preferably not more than 10, % by weight, based on the sum of components (a)+(b).

The photocurable layer employed according to the invention furthermore contains one or more photopolymerization initiators (c). Suitable initiators are the conventional compounds and systems for initiating a photopolymerization reaction in photocurable compositions during exposure to actinic light, these compounds being adequately described in the relevant specialist literature. They include acyloins and their derivatives, such as benzoin, benzoin alkyl ethers, $\alpha$-methylolbenzoin and its ethers and $\alpha$-methylbenzoin and its ethers, and in particular the vicinal diketones and their derivatives, e.g. benzil and benzil ketals, in particular benzil dimethyl ketal, benzil methyl ethyl ketal, benzil methyl benzyl ketal and benzil ethylene glycol ketal. Another group of particularly advantageous polymerization initiators are the acylphosphine compounds, as described in, for example, German Laid-Open Applications DOS No. 2,830,927, DOS No. 2,909,994, DOS No. 3,020,092, DOS No. 3,034,697, DOS No. 3,114,341 and DOS No. 3,133,419. Examples of these compounds are 2,6-dimethoxybenzoyldiphenylphosphine oxide, 2,4,6-trimethylbenzoyldiphenylphosphine oxide, ethyl 2,4,6-trimethylbenzoylphenylphosphinate and 2,4,6-trimethylbenzoyl-bis(o-tolyl)phosphine oxide. The photopolymerization initiators also include unsubstituted and substituted quinones, e.g. anthraquinone and benzanthraquinone, and benzophenone and its derivatives, in particular 4,4'-bis(-dimethylamino)benzophenone. The said initiators (c) are present in the photocurable layer in general in amounts of from 0.01 to 10, preferably from 0.05 to 5, % by weight, based on the total photocurable layer.

The said layer can, if desired, also contain the usual amounts of other conventional additives and/or assistants (d). These include, in particular, thermalpolymerization inhibitors, inorganic and organic pigments and dyes, inorganic and organic fillers, plasticizers, dulling agents and lubricants, and may include other polymeric binders which are compatible with the partially crystalline polymeric binders present as component (a) in the layer, and sensitometric regulators when the novel process is used for optical information fixing, in particular for the production of printing or relief plates or resist images, etc. The photocurable layer contains the other conventional additives and/or assistants (d) in general in amounts of not more than 50, in particular not more than 20, % by weight, based on the said layer.

The photocurable layer used in the novel process can be produced in a conventional manner by mixing the individual components to give a homogeneous, photopolymerizable or photocrosslinkable mixture, and shaping the latter to produce a layer of the desired thickness. Homogeneous mixing of the components can be carried out by a conventional kneading, mixing or dissolving method. The photocurable layer can then be produced by, for example, casting from a solution of the mixture in a suitable solvent, e.g. tetrahydrofuran, toluene or the like, onto a suitable base, evaporating the solvent and drying the layer. The photocurable layer can also be formed by pressing, calendering or extruding the homogeneous, photopolymerizable or photocrosslinkable mixture, and, if desired, the resulting layer can be applied onto a base subsequently or simultaneously. The thickness of the photocurable layer which is generally solid at room temperature, depends on the particular intended use of the said layer, and can therefore vary within wide limits. Since the novel process is equally suitable for the production of coatings and resist images and for the preparation of printing plates, relief plates and self-supporting films and sheets, the photocurable layers used in this process can be from a few $\mu$m, e.g. from 1 to 2 $\mu$m, to a few mm, e.g. from 5 to 6 mm, thick.

According to the invention, in order to produce the photocured layers possessing a defined hardness, the photocurable layers are first subjected to a heat treatment in which the partially crystalline parts of the polymeric binder (a) are partially or completely fused. The temperature employed for this heat treatment depends on the partially crystalline polymeric binder (a) present in the photocurable layer. The temperature is also dependent on the extent to which the partially crystalline parts of the polymeric binder (a) are to be fused, and in this context is correlated to the duration of the heat treatment. In general, the temperature during the heat treatment should therefore be above the melting point of the partially crystalline parts of the polymeric binder (a), but below the temperature at which the said binder (a) or the photocurable layer suffers thermal damage. If the novel process is to be used for optical information fixing, for example for the production of relief or printing plates or resist images, care should be taken to ensure that the heat treatment is carried out at a temperature at which the layer does not undergo any chemical crosslinking or hardening, since otherwise, after the subsequent imagewise exposure and photocuring, development of the relief structures or resist images may be adversely affected. In general, temperatures of from 50° to 130° C., in particular from 60° to 120° C., have proven very advantageous for the heat treatment according to the invention.

The duration of the said heat treatment depends on the temperature chosen for this treatment, and in particular on the desired hardness of the layer after the photocuring procedure. The longer the duration of the heat treatment, i.e. the larger the amount of partially crystalline polymeric binder (a) which is to be fused, the more resilient and flexible and the softer is the cured layer obtained after photocuring. The duration of the heat treatment is in general from 1 to 120 minutes, and from 5 to 60 minutes have proven sufficient and particularly advantageous. The heat treatment can also be carried out in a number of stages, at two or more different temperatures or with increasing temperatures. However, with regard to the properties of the resulting photocured layer, these procedures generally have no significant advantages over a heat treatment at a constant temperature. The heat treatment itself can be carried out in any suitable manner and using any suitable agents and apparatuses. For example, it can entail exposing the photocurable layer to a stream of warm air, for example in an oven. It is, however, also possible to introduce the necessary heat into the photocurable layer by means of heat radiation, for example by irradiating the layer with an infrared lamp. Advantageously, the heat treatment of the photocurable layer is carried out so that the layer is exposed uniformly and on all sides to the heat-producing or heat-transfer medium.

Following the heat treatment, the layer is cured by exposure to actinic light. Photocuring can be carried out directly after the heat treatment, but it is also possible first to store the heat-treated photocurable layer and then to expose it to actinic light and cure it. However, the period between the heat treatment and the photocuring procedure must not be so long that the fused partially crystalline parts of the polymeric binder (a) undergo complete recrystallization. It has proven very advantageous first to allow the photocurable layer to cool down once again to room temperature after the heat treatment, cooling generally requiring from 5 to 15 minutes, and then to cure the layer immediately by exposure to actinic light. If the layer is to be stored after the heat treatment and before photocuring, this storage period should, as far as possible, not exceed 60 minutes. In some cases, it may also be advantageous to photocure the heat-treated layer directly after the heat treatment, either before or during the cooling process.

Irradiation of the heat-treated layer in order to harden it is carried out with actinic light having a wavelength of, in general, from 230 to 600 nm, preferably from 300 to 420 nm. Suitable light sources for the irradiation procedure are the conventional ones which emit actinic light in the stated wavelength range, e.g. carbon arc lamps, mercury vapor lamps, xenon lamps, superactinic fluorescent tubes or pulsed lamps. The exposure time is in general from 1 second to 12 minutes, preferably from 5 seconds to 5 minutes.

The heat-treated layer can be exposed uniformly or imagewise, e.g. through a photographic negative, to the actinic light. In the case of uniform exposure, the entire layer is cured, so that this version of the process is suitable for the production of coatings, self-supporting layers, films or sheets, for example compensating layers, backing sheets, makeready sheets, etc. In the case of exposure through an image-bearing transparency, photopolymerization is initiated only in the areas of the layer which are exposed imagewise, so that only these areas of the layer are cured. The unexposed, uncured areas of the layer can then be removed in a conventional manner, in particular by washing out with a developer, to form a relief structure or a resist image. Depending on the type of polymeric binder (a) present in the layer and on the other components of the layer, suitable developers are organic solvents, in particular alcohols and alcohol/water mixtures, as well as aqueous systems, in particular water itself. After the unexposed areas of the layer have been removed, the cured areas can, if required, be dried and post-exposed. Imagewise exposure and curing of the layer are suitable for the production of printing and relief plates, in particular for letterpress and gravure printing, and also for the production of resist images and offset printing plates.

Irradiation of the heat-treated layer initiates photopolymerization in this layer and crosslinking of the components, in particular of the polymeric binder (a) and of any low molecular weight polymerizable compounds (b) which may be present, the layer thus being cured. We have found that this curing of the layer, which is initiated by exposure to actinic light, results in the partially crystalline polymeric binder (a) being fixed permanently in the state in which it exists after the heat treatment. The said binder (a) has an important effect on the hardness and flexibility of the photocured layers, so that it is possible to use the novel process to produce photocured layers possessing different defined hardnesses by varying the type and extent of the heat treatment, without it being necessary for this purpose to change the amount and/or the type of components of the mixture forming the curable layer. For example, when polyurethanes are used as partially crystalline polymeric binders (a), it is possible to vary the Shore A hardness of the photocured layers in a range from 50 to 90, depending on the duration and temperature of the heat treatment.

The Examples which follow illustrate the invention. Parts and percentages are by weight, unless stated otherwise. The stated K values were measured on a 1% strength solution in dimethylformamide, and the Shore A hardness was determined in accordance with DIN 53,505, and the tensile strength and elongation at break in accordance with DIN 53,504.

EXAMPLE 1

1.1

400 g of polyethylene oxide having a molecular weight of about 1,000, 32.15 g of a 70% strength solution of bisphenol A diglycidyl ether diacrylate in acetone, and 31.5 g of butane-1,4-diol were dissolved in 600 g of tetrahydrofuran at room temperature, while stirring. 1.1 g of dibutyl-tin dilaurate were added, after which 148.7 g of hexamethylene diisocyanate were introduced, the temperature increasing to about 60° C. After 90 minutes, the reaction mixture was diluted with 415 g of tetrahydrofuran, and, after a further 15 minutes, any isocyanate groups still present were deactivated by adding 40 g of methanol. The resulting polyether-urethane possessing acryloyl side groups had a K value of 56 and a Shore A hardness of 80.

1.2

78.5 parts of the polyurethane prepared as described in 1.1, 20 parts of a urethane diacrylate prepolymer (consisting of one equivalent of a polyester diol, two equivalents of isophorone diisocyanate and two equivalents of hydroxyethyl acrylate), 1.5 parts of benzil dimethyl ketal, 0.02 part of Zapon Fast Black RE (C.I. 12195, Solvent black 34), 0.25 part of the potassium salt of N-nitrosocyclohexylhydroxylamine and 0.025 part of sec.-butylthioanthraquinone were dissolved in tetrahydrofuran at 50° C., while stirring, to give an about 50% strength solution. This solution was cast onto a polyester film in a thickness such that drying for one hour at 60° C. resulted in a 0.7 mm thick layer. The photopolymerizable, photocurable layer produced in this manner was laminated, on the free surface, with a metal baseplate which had been treated beforehand with a commercial polyurethane finish.

1.3.

Three different samples of the raw plate produced as described in 1.2 were each heated for 10 minutes in a through-circulation oven at 60°, 80° or 100° C. The individual samples were cooled to room temperature, after which the polyester film was peeled off from the photopolymerizable, photocurable layer and all three samples were exposed imagewise for 4 minutes through a photographic negative in the same manner, using a commercial flat-plate exposure unit (40 watt UV fluorescence lamps). The exposed plates were then washed out with an ethanol/water mixture, the unexposed areas of the layer being dissolved away. The resulting relief plates were then dried for 30 minutes at 60° C. and post-exposed uniformly.

The hardness, elongation at break and tensile strength of the relief layers of the resulting relief plates are shown in the table below. Depending on the temperature employed in the heat treatment, it was possible to vary the degree of hardness of the relief layer. The degrees of hardness were very readily reproducible, and remained unchanged even during storage and use of the relief plates. The relief plates obtained were very useful as printing plates for inks based on mineral oil. The harder plate (temperature of heat treatment 60° C.) was particularly suitable for printing line motifs, while the soft plate (temperature of heat treatment 100° C.) was preferably used for printing screen motifs. The prints showed exact reproduction of the original and had crisp details. The printing plates possessed very good flexibility.

TABLE

|  | Temp. of heat treatment | Shore A hardness | Elongation at break [%] | Tensile strength N/mm$^2$ |
|---|---|---|---|---|
| Sample a | 60° C. | 78 | 36 | 9.1 |
| Sample b | 80° C. | 73 | 41 | 7.8 |
| Sample c | 100° C. | 65 | 38 | 6.6 |

COMPARATIVE EXPERIMENT A

The procedure described in Example 1 was followed exactly, except that in this case the heat treatment of the photopolymerizable, photocurable layer prior to the imagewise exposure was dispensed with. The relief layer of the resulting relief plate had a Shore A hardness of 82.

EXAMPLE 2

In this Example, the photopolymerizable, photocurable layer was produced using a polyurethane which possessed acryloyl side groups and was prepared by a procedure similar to that of Example 1.1, from 400 g of a polyethylene oxide having a molecular weight of 1,000, 89.6 g of bisphenol A diglycidyl ether diacrylate, 31.5 g of butane-1,4-diol and 176 g of hexamethylene diisocyanate. This polyurethane was used to produce a photopolymerizable layer on a polyester film by the procedure described in Example 1.2, and a further polyester film coated with a commercial 2-component contact adhesive was applied onto the free surface of the photopolymerizable layer by means of rollers.

The resulting multilayer element was stored in a through-circulation oven for 10 minutes at 100° C. The photopolymerizable layer was then exposed through a photographic negative, washed out with ethanol/water, dried for 60 minutes at 60° C. and then post-exposed uniformly for 10 minutes, these steps being carried out as described in Example 1.3.

The relief layer of the resulting relief plate had a Shore A hardness of 65, a tensile strength of 8 N/mm$^2$ and an elongation at break of about 70%. The relief plate obtained possessed high resolving power and was very useful as a flexographic printing plate, giving long print runs.

COMPARATIVE EXAMPLE B

The procedure described in Example 2 was followed, except that in this case the heat treatment of the photopolymerizable, photocurable layer was dispensed with. The relief layer of the resulting relief plate had a Shore A hardness of 85.

EXAMPLE 3

A photopolymerizable layer consisting of the following components was prepared as described in Example 1.2: 78.3 parts of a polyurethane binder (prepared from hexamethylene diisocyanate, polyethylene glycol having a molecular weight of 1,000, cyclohexanedimethanol and bisphenol A diglycidyl ether diacrylate), 20 parts of the urethane diacrylate prepolymer of Example 1.2, 1.2 parts of benzil dimethyl ketal, 0.02 part of Neutral Red (C.I. 50040), 0.03 part of 2-sec.-butylthioanthraquinone, 0.3 part of the potassium salt of N-nitrosocyclohexylamine, and 0.2 part of 2,6-di-tert.-butyl-p-cresol. The thickness of the photopolymerizable, photocurable layer produced was 0.45 mm in this case.

Photopolymerizable, photocurable layers produced in this manner were stored at various temperatures from 60° to 100° C. and for various periods from 10 to 60 minutes in a through-circulation oven, were cooled to room temperature and were then exposed uniformly to a UV fluorescent lamp as described in Example 1. The resulting cured layers had Shore A hardnesses of from 65 to 80; the degrees of hardness obtained under the specific process conditions were very readily reproducible, and the hardness of the layers remained unchanged after exposure to actinic light.

Photocurable layers which contained, as the polymeric binder, nylons, urethane-modified nylons, polyether-esters, each possessing acryloyl side groups, were produced by a procedure similar to that described in Example 3. These layers were heat-treated by a method similar to that described in Example 3, and were cured by exposure to actinic light. The results obtained were similar to those of Example 3.

We claim:

1. A process for producing a printing plate having a defined degree of hardness which comprises:
   (a) heating a solid photocurable layer containing one or more partially crystalline polymeric binders at a temperature of from about 50° to about 130° C. for a sufficient period of time to partially or completely fuse the partially crystalline parts of the polymeric binder, said partially crystalline polymeric binder being a polyurethane, a polyurethane-polyurea, a urethane-containing nylon having olefinic double bonds in side groups, a nylon possessing olefinic double bonds capable of undergoing polymerization, or being a polyether-ester possessing olefinic bonds in side groups;
   (b) exposing the heated layer imagewise to actinic light before the fused portions undergo complete recrystallization to photocure the exposed areas of the layer, and
   (c) thereafter washing out the unexposed and uncured areas of the layer to develop the printing plate.

2. The process of claim 1, wherein the photocurable layer furthermore contains one or more photopolymerizable, olefinically unsaturated, low molecular weight compounds.

3. The process of claim 1, wherein the heat treatment is carried out for from 1 to 120 minutes.

4. A process as claimed in claim 1, wherein the heat treatment is carried out so that chemical crosslinking or curing of the photocurable layer does not take place.

5. The process of claim 1, wherein the layer is cooled to about room temperature after the heating step and before the layer is exposed to actinic light.

6. The process of claim 1, wherein the layer is exposed to actinic light immediately after the layer is cooled to about room temperature.

* * * * *